United States Patent [19]

Rousseau et al.

[11] 4,451,613

[45] May 29, 1984

[54] ETHYLENICALLY-UNSATURATED DEXTRIN OLIGOMERS

[75] Inventors: Alan D. Rousseau; Laurence W. Reilly, Jr., both of St. Paul, Minn.

[73] Assignee: Minnesota Mining and Manufacturing Company, St. Paul, Minn.

[21] Appl. No.: 471,781

[22] Filed: Mar. 3, 1983

[51] Int. Cl.$^3$ ............................................. C08L 3/00
[52] U.S. Cl. ..................... 525/54.31; 526/238.22; 536/46; 536/50; 536/103; 536/111
[58] Field of Search ................... 536/103, 106, 50, 46, 536/111; 525/54.31; 526/238.22

[56] References Cited

U.S. PATENT DOCUMENTS

| | | | |
|---|---|---|---|
| 3,085,008 | 4/1963 | Case | 96/75 |
| 3,419,394 | 12/1968 | Bach | 96/75 |
| 3,867,147 | 2/1975 | Teuscher | 96/33 |
| 4,060,506 | 11/1977 | Verbanac | 536/50 |
| 4,079,025 | 3/1978 | Young et al. | 536/50 |
| 4,115,332 | 9/1978 | Young et al. | 536/50 |
| 4,117,222 | 9/1978 | Holst et al. | 536/50 |
| 4,147,549 | 4/1979 | Held | 96/33 |
| 4,198,236 | 4/1980 | Held | 430/306 |

*Primary Examiner*—Ronald W. Griffin
*Attorney, Agent, or Firm*—Donald M. Sell; James A. Smith; Lorraine R. Sherman

[57] ABSTRACT

A photocurable, ethylenically-unsaturated, water-soluble oligomer comprising the reaction product of 100 parts by weight of a dextrin compound, and 35 to 70 parts by weight of at least one ethylenically-unsaturated monomer capable of reacting with at least one hydroxyl group of the dextrin compound, the oligomer having an average in the range of 0.1 to 0.7 ethylenically-unsaturated moiety per anhydroglucose unit and an equivalent weight of 440 to 990, and at least 75 weight percent of the oligomer is water soluble at 20° C. in a concentration of at least 2.5 percent by weight. The oligomer when photocured in combination with an ethylenically-unsaturated monomer is useful as a photoresist in positive-acting, water-developable, lithographic printing plates.

11 Claims, No Drawings

ETHYLENICALLY-UNSATURATED DEXTRIN OLIGOMERS

DESCRIPTION

1. Technical Field

This invention relates to novel, water-soluble, ethylenically-unsaturated dextrin oligomers and a process for their preparation. The oligomers, when mixed with ethylenically-unsaturated monomers, are photo-crosslinkable to water-insoluble polymers which remain hydrophilic and are useful as photoresists in positive-acting, water-developable, lithographic printing plates.

2. Background Art

Positive-acting, water-developable, lithographic printing plates having a photopolymerizable, light-sensitive layer are known in the art. Such plates generally comprise an oleophilic support covered with a layer containing a water-soluble monomer which polymerizes to a hydrophilic, water-insoluble polymer. Upon water development the unexposed monomer leaches out and leaves the oleophilic polymer on the surface. Upon treatment with ink and water, the hydrophilic polymer becomes wetted with water and the ink adheres to the oleophilic surface, thereby producing a lithographic printing plate. Such plates are described, for example, in U.S. Pat. Nos. 4,147,549 and 4,198,236 and have a support bearing a layer comprising a polymerizable, ethylenically-unsaturated, leachable, monomeric compound of hydrophilic character and an oleophilic, polymeric binder. U.S. Pat. Nos. 3,867,147, 3,085,008, and 3,419,394 relate to lithographic plates comprising an oleophilic layer overcoated with a water-soluble, material mixed with a diazo compound, said diazo compound being light sensitive and decomposable so as to effect crosslinking in the water-soluble material. Upon curing, the hydrophilic polymer becomes water-insoluble but is still hydrophilic.

Copolymerizable, film-forming starch compositions having a small degree of appendant ethylenically-unsaturated groups, such as acrylamidomethyl groups, have been disclosed in U.S. Pat. No. 4,079,025 and are useful as textile sizes or finishes, adhesives, binders, fabric printing aides, and thickeners. Mention is made in the patent of the water-resistant and wet- and dry-rub resistance of the starch copolymerizates. The acrylamido-metyl starches disclosed, because of their relatively high molecular weight and low degree of substitution, do not provide, even when combined with monomers, a durable hydrophilic layer useful as a resist in positive-acting, water-developable, lithographic printing plates.

SUMMARY OF THE INVENTION

The present invention provides a water-soluble oligomer comprising a dextrin having an average of 0.1 to 0.7, and preferably 0.20 to 0.45, ethylenically-unsaturated moiety per anhydroglucose unit and an equivalent weight of 440 to 990.

When the oligomer of the invention is mixed with at least one ethylenically-unsaturated monomer and the mixture is cured photochemically, a water-insoluble yet water-receptive (hydrophilic), ink-repellent polymer is obtained. This polymer has good wet-scratch resistance and is well-suited for use as a resist in positive-acting water developable lithographic printing plates. In preparing plates of this type, the water-soluble oligomer is mixed with ethylenically-unsaturated monomers, sensitizers, initiators, hydrophilic fillers and pigments and is coated onto the surface of a support which has been rendered oleophilic. During image-wise exposure under a positive master, the mixture cross-links and anchors to the oleophilic support as a water-insoluble, hydrophilic layer. The unexposed areas of the layer are removed by water development, and the oleophilic support is bared in these areas. The unexposed areas are ink receptive and will represent the image area accepting and transferring the printing ink. A positive-acting printing plate is thus formed.

As used in this application:

"anhydroglucose" means a unit having the following structure:

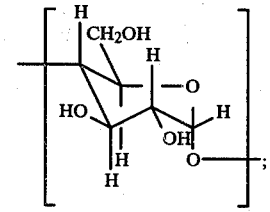

"d.s." (degree of substitution) means the fraction of anhydroglucose units reacted with an ethylenically-unsaturated monomer; and "dextrin" means a carbohydrate intermediate in chain length between starch and glucose. It is produced from starch, as is known in the art, by hydrolysis with (1) dilute acids, (2) amylase, or (3) dry heat in the presence of an acid catalyst, so as to produce lower molecular weight fragments.

DETAILED DISCLOSURE

The present invention provides a photocurable oligomer comprising the reaction product of (1) 100 parts by weight of a dextrin compound, said dextrin compound being non-gelling at temperatures up to 98° C. when heated in the presence of water, N-methylolacrylamide, and acid, and (2) 35 to 70 parts by weight of at least one ethylenically-unsaturated monomer capable of reacting with at least one hydroxyl group of the dextrin compound, said oligomer having an average in the range of 0.1 to 0.7, and preferably 0.20 to 0.45, ethylenically-unsaturated moiety per every anhydroglucose unit and an equivalent weight of 440 to 990, and at least 75 weight percent of said oligomer is water-soluble at 20° C. in a concentration of at least 2.5 percent by weight.

The water-soluble, ethylenically-unsaturated dextrin oligomers have the formula

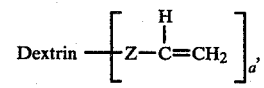

wherein Z is an organo linking group linking the terminal ethylenically unsaturated group to the dextrin chain; dextrin represents a hydrolyzed starch chain; "a" represents an average degree of substitution in the range of 0.1 to 0.7; and R is selected from the group consisting of hydrogen and a lower alkyl (one to four carbon atoms) radical. Preferably R is hydrogen or a methyl or ethyl group. Preferably "a" is 0.20 to 0.45.

Z is a divalent organo linking group comprising a small number of carbon, nitrogen, and oxygen atoms (preferably 8 atoms or less) and as high a ratio of heteroatoms (nitrogen, oxygen) to carbon atoms as possible. Examples of Z include:

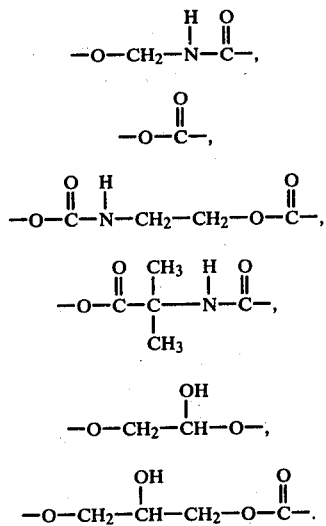

The preferred Z has the following structure:

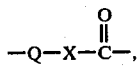

where Q is a divalent organo group preferably having 6 atoms or less with as high a ratio of hetero atoms (nitrogen, oxygen) to carbon atoms as possible and X is N—H or O. The most preferred Z has the structure

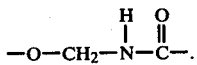

Examples of ethylenically-unsaturated dextrin oligomers of the invention include:

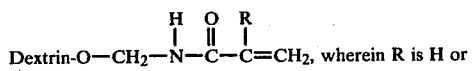
(1) wherein R is H or lower alkyl,

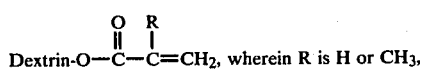
(2) wherein R is H or CH₃,

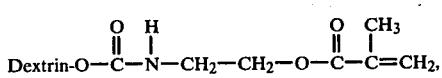
(3)

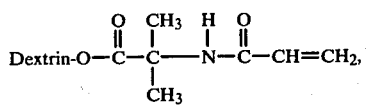
(4)

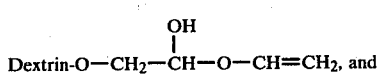
(5)

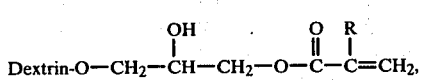
(6)

wherein R is H or CH₃.

The ethylenically-unsaturated dextrin oligomers of the invention may be prepared by a variety of processes used to convert hydroxyl groups to ethylenically-unsaturated moieties. Ethylenically-unsaturated dextrin esters or ethers [see formulas (2), (5), (6) above] may be obtained by reacting dextrin with ethylenically-unsaturated, organic carboxylic anhydrides (i.e., methacrylic anhydride, etc.) or, epoxides (e.g., butadiene monoxides, etc.) as is disclosed in U.S. Pat. No. 2,668,156 by Caldwell, et al. In the case of the carboxylic anhydride reaction, the purification process may be modified by precipitating the product from water with the addition of a water-miscible, polar organic solvent such as methanol. Dextrins may also be reacted with 2-isocyanatoethylmethacrylate (IEM) by slurrying the dextrin in a polar organic solvent such as N,N,-dimethylformamide or pyridine, adding IEM and an appropriate catalyst such as dibutyltin dilaurate, and heating until the reaction is complete. This reaction introduces the methacrylate moiety to the dextrin (see formula (3) above). The acrylamide moiety (see formula (4) above) may be introduced by reacting dextrin with a vinyl azlactone (e.g., 2-vinyl-4,4'dimethyl-2-oxazolin-5-one). As with IEM, the dextrin may be slurried in a polar organic solvent and the vinyl azlactone added with a catalyst such as boron trifluoride etherate or ethanesulfonic acid.

The preferred oligomers of the present invention (see formula (1) above) are prepared by the following general method. To a glass or glass-lined reaction vessel fitted with an agitator, an overhead condenser suitable for distillation, a temperature control, and an inert air sweep, is added 35 to 70 parts by weight of N-methylolacrylamide, 60 to 120 parts by weight of water, 1 to 6 parts by weight of acrylic or other carboxylic acid catalyst, and 0.0002 to 0.0006 parts by weight of a polymerization inhibitor such as phenothiazine. To this is added, with agitation, 100 parts by weight of a suitable dextrin. The mixture is agitated until uniform and then heated to 82°–98° C. with an inert air sweep. When 30 to 60 parts by weight of water has been distilled and collected, the batch is cooled to about 27° C. and 75 to 150 parts by weight of deionized water is added. The cool solution is filtered and it is added with agitation during a 10 to 20 minute period to 1200 to 2400 parts by weight of methanol in a glass or glass-lined vessel. The product is filtered and vacuum or forced-air-dried for several days to give 110 to 210 parts by weight of a chunky white solid. The product can be analyzed for residual monomer and incorporated unsaturation using proton and $^{13}$C NMR spectroscopy. Alternatively, residual monomer can be analyzed for using a 300 mm×7.8 mm HPLC (high performance liquid chromatography) carbohydrate analysis column (Aminex® Carbohydrate HPX-42, BioRad Corp., Richmond, CA).

The incorporated unsaturation from reacted monomer can vary from a degree of substitution of 0.1 to 0.7, preferably 0.20 to 0.45, and unreacted monomer is usually found to be less than one weight percent. This means it is possible to make dextrin oligomers with equivalent weights of 440 to 990, depending on the desired application. A limiting factor in this process is the choice of dextrin. As very high percent solids is approached, certain dextrin solutions in the presence of acid and N-methylolacrylamide tend to gel at high temperature and are unsuitable for use in the present invention. Yellow or canary corn dextrins which have relatively high solubility (70 to 90 percent soluble in water) at 25° C. (77° F.) are preferred. Some less soluble white dextrins also are useful. Other dextrins which are useful in the present invention can be heated in the presence of water, N-methylolacrylamide, and a carboxylic acid such as acrylic acid to very high percent solids with no deleterious effects. Such useful dextrins include:

(1) hydrolyzed starch (i.e., dextrin), Amaizo 1407 Dextrin (American Maize-Products Co.)
(2) medium-low viscosity yellow or canary corn dextrin, Amaizo 1740 Dextrin (American Maize-Products Co.)
(3) corn-based dextrin 23 to 30 percent soluble in cold water, Stadex ® 27 (A. E. Staley Mfg. Co., Decatur, IL)
(4) corn-based dextrin 38 to 53 percent soluble in cold water, Stadex ® 50 (A. E. Staley Mfg. Co.) and
(5) corn-based dextrin 75 to 90 percent soluble in cold water, Stadex ® 140 (A. E. Staley Mfg. Co.).

Examples of high-temperature-gelling dextrins (in the presence of acid and N-methylolacrylamide) are:

(1) malto-dextrin product produced by hydrolizing corn starch, Amaizo Fro-Dex ® 10 (American Maize-Products Co., Hammond, Indiana)
(2) malto-dextrin product produced from hydrolysed low conversion corn syrup, Amaizo Fro-Dex ® 15 (American Maize-Products Co.) and
(3) medium soluble, medium viscosity white corn dextrin, Amaizo 1174 Dextrin (American Maize-Products Co.).

The most preferred Z group is

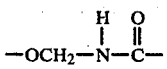

and the preferred ethylenically-unsaturated monomer useful in the present invention is N-methylolacrylamide (hereinafter sometimes referred to as NMA), available from American Cyanamid Co., Wayne, NJ.

Most preferably the oligomer of the present invention is an acrylamidomethyl dextrin having the formula

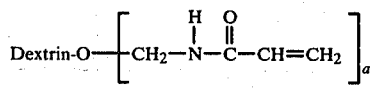

wherein a is as defined above.

A process for reacting NMA with starch is disclosed in the art (U.S. Pat. No. 4,079,025) and produces ethylenically-unsaturated starch which when combined with an ethylenically-unsaturated monomer and photopolymerized forms water-insoluble polymers that lack scratch resistance when used as the hydrophilic background in a positive-acting, water-developable, lithographic printing plate. TABLE I compares the process used in the cited patent with that of the present invention.

TABLE I

| Processes For Reacting NMA With Starch/Dextrin | | |
|---|---|---|
| | Process of U.S. Pat. No. 4,079,025 | Process of present invention |
| reactants | starch/NMA | dextrin/NMA |
| concentration | high (dough or paste) | low (slurry + solution) |
| catalyst | NH₄Cl | acrylic acid or other carboxylic acid |
| time/temperature | 45 min/125° C. | 2-4 hours/93° C. |
| purification | wash with water | precipitated in methanol |
| inhibitor | hydroquinone | hydroquinone or phenothiazine |

A key part of the process of the present invention occurs in the purification step. The product of the present invention is water-soluble and thus cannot be washed with water. It is precipitated from a polar organic solvent, such as a low molecular weight alcohol which preferably is methanol. The purification method of the present invention provides for the removal of any unused monomer and catalyst from the product oligomer. Such removal prevents further changes, such as gelation of the composition or formation of toxic volatile products during storage.

The oligomers of the present invention, when mixed with a water-soluble Michler's ketone (disclosed in assignee's copending patent application, U.S. Ser. No. 471,838, filed Mar. 3, 1983), an initiator, and at least one ethylenically-unsaturated monomer provide a hydrophilic top coat (disclosed in Assignee's copending patent application, U.S. Ser. No. 471,828, filed Mar. 3, 1983) for positive-acting, water-developable, lithographic printing plates (disclosed in assignee's copending patent application U.S. Ser. No. 471,808, filed Mar. 3, 1983). Ethylenically-unsaturated monomers that can be photocured in combination with the oligomers of the present invention when preparing the above-mentioned hydrophilic topcoat are water-soluble, polymerizable compounds including acrylamides and methacrylamides such as N-methylolacrylamide, methylene bisacrylamide, diacrylamidomethylether, and diacetone acrylamide; acids such as acrylic acid and methacrylic acid; and monomers with water-solubilizing groups such as sulfonated monomers (e.g., 3-sulfo-2-hydroxypropyl-methacrylate). The oligomers photopolymerize to a hydrophilic, water-insoluble polymer which provide the background of the imaged plate.

Objects and advantages of this invention are further illustrated by the following examples, but the particular materials and amounts thereof recited in these examples, as well as other conditions and details, should not be construed to unduly limit this invention.

EXAMPLE 1

To a solution of 45.5 g of 60 percent N-methylolacrylamide, 1.6 g of acrylic acid, 0.6 g of 0.5 percent hydroquinone and 26.2 g of deionized water was added 51.0 g of dextrin (Matheson Coleman & Bell white corn). The resulting slurry was allowed to stand at room temperature for four hours and then heated to 94° C. (200° F.) for 130 minutes in a forced-air oven at which time the reaction mixture was determined to be 81 percent solids. After cooling, water was added to give a 25 percent solids solution. A portion of this solution was added to rapidly-stirred methanol and the resulting white precipitate, designated dextrin-NMA, was air dried to 92 percent solids. Elemental analysis gave: C, 42.3 percent; H, 6.8 percent; N, 1.9 percent. Correcting for the 8 percent volatiles (probably water) this amount of nitrogen corresponded to a degree of substitution (D.S.)=0.25 or 25 percent of the glucose units reacted with N-methylolacrylamide. It was further calculated that in the crude reaction mixture there remained 25 weight percent of free unreacted NMA monomer.

EXAMPLE 2

A solution was prepared by combining 334.8 g of 48% N-methylolacrylamide, 10.2 g of acrylic acid, 3.9 g of 0.5 percent hydroquinone and 87.6 g of water. To this solution was added 300 g of a canary dextrin, Stadex ® 140 (A. E. Staley Mfg. Co.). This 64 percent solids slurry after standing at room temperatures for 2¼ hours was heated to 94° C. (200° F.) for 4 hours in a forced air oven. After this time the slurry clarified and had concentrated to 77 percent solids. The resulting viscous solution was cooled and diluted to 50 percent solids with water, filtered through cheese cloth, and poured into rapidly-stirred methanol. The resulting white solid was filtered and dried in vacuo to remove water and methanol. Analytical results were as follows: $^1$H NMR: 31 percent of anhydroglucose units reacted with NMA, 5 weight percent of methanol, 4 weight percent of water; $^{13}$C NMR: no significant NMA monomer or diacrylamidomethylether; elemental analysis: C, 42.2 percent; H, 6.2 percent; N, 2.2 percent (corresponding to 29.6 percent of anhydroglucose units reacted with NMA at 90 percent solids).

EXAMPLE 3

To a one-liter split resin flask fitted with a paddle agitator, distillation head, thermometer, and nitrogen purge was added 161 parts by weight of N-methylolacrylamide in 163.8 parts by weight of water, and 10.2 parts by weight of acrylic acid, 0.02 parts by weight of hydroquinone, and 91.5 parts by weight of deionized water. To this 300 parts by weight of corn-based dextrin Stadex ® 140 was added over a period of 5 to 10 minutes with vigorous agitation. The resultant viscous slurry was agitated until uniform and then heated with a nitrogen sweep for 4 hours during which time 115 parts by weight of water was distilled off. To the hot slurry 320 parts by weight of deionized water was added with agitation and the solution allowed to cool. The cool solution was added to 5 liters of methanol with agitation. The resultant solid mass was filtered. The cake was broken up into small pieces and vacuum dried at room temperature to give 344 parts by weight of a granular solid. NMR analysis of the product showed it to contain 26 percent incorporated N-metylolacrylamide.

EXAMPLE 4

Using the same procedure as in Example 1, except replacing the hydroquinone with 0.04 parts by weight phenothiazine, 412 parts by weight of a granular solid was obtained. The product contained 27 percent incorporated N-methylolacrylamide.

EXAMPLE 5

Using the procedure as in Example 2 except replacing the corn-based dextrin Stadex ® 140, with 300 parts by weight of corn-based (highly-branched amylopectin) dextrin, Stadex ® 201 (A. E. Staley Mfg. Co.), 296 g of a light-yellow powder was obtained. The product contained 30 percent incorporated N-methylolacrylamide.

EXAMPLE 6

Using the same procedure as in Example 2, except replacing the corn-based dextrin Stadex ® 140 with 300 parts by weight of the corn-based (highly-branched amylopectin) dextrin Stadex ® 230 (A. E. Staley Mfg. Co.), 307 g of a yellow powder was obtained. The product contained 24 percent incorporated N-methylolacrylamide.

EXAMPLE 7

To a 94.6 liter (25 gallon) glass-lined kettle fitted with an anchor agitator, an overhead condenser suitable for distillation, a temperature control, and an inert air sweep was added 11.1 kg (24.6 lb.) of N-methylolacrylamide in 12.1 kg (26.7 lb.) water, 0.72 kg (1.6 lb.) of acrylic acid, 7.5 g of phenothiazine, and 6.3 kg (14.0 lb.) of deionized water. To this mixture, 20.7 kg (46 lb.) of the corn-based dextrin, Stadex ® 140, was added with agitation. The mixture was agitated until uniform and then heated to 91° C. (195° F.) with an inert air sweep. When 8.9 kg (19.8 lb.) of water was distilled and collected, the batch was cooled to 27° C. (80° F.) and 23.4 kg (52 lb.) of deionized water added. The cool solution was filtered and added over a 15 minute period to 375 kg (833 lb.) methanol in a 568 liter (150 gal.) glass-lined kettle with agitation. The product was vacuum filtered and dried in trays at 38° C. (100° F.) for several days to give 33.8 kg (75 lb.) of a chunky solid. The product contained 32 percent incorporated N-methylolacrylamide.

EXAMPLE 8

The following dextrins were screened for use as resists in positive-acting, water-developable lithographic printing plate technology. All were prepared using the method of Example 2. If the oligomer gelled it was deemed unsatisfactory. The dextrins used and results obtained are tabulated in TABLE II.

TABLE II

| Dextrins Screened for Use as Resists | | |
|---|---|---|
| Dextrin (Vendor) | Reaction with NMA*[a] | Percent NMA incorporation (byNMR)[b] |
| white corn dextrin (Matheson Coleman & Bell, Norwood, Ohio) | A | 45 |
| hydrolyzed cereal solids, Mor-rex ® 1918 (CPC Int'l, Inc.) | B | — |
| malto-dextrin, Amaizo Fro-Dex ® 10 | B | — |
| dextrin, Amaizo 1895 | A | results inconclusive[c] |
| hydrolyzed starch dextrin, Excello ® 8051 (Corn Prdts. Co.) | A | 33 |
| corn-based dextrin (8 to 12 percent soluble), Stadex ® 9 | B | — |
| corn-based dextrin, Stadex ® 27 | A | 43 |
| malto-dextrin, Amaizo Fro-Dex ® 15 | B | — |
| corn dextrin, Amaizo 1740 | A | 45 |
| corn dextrin, Amaizo 1174 | B | — |
| medium-soluble dextrin, Amaizo 1407 | A | 34 |
| corn-based dextrin, Stadex ® 50 | A | 36 |
| corn-based dextrin (59 to 71 percent soluble), Stadex ® 60K | B | — |
| corn-based dextrin (75 to 85 percent soluble), Stadex ® 79 | B | — |

TABLE II-continued

Dextrins Screened for Use as Resists

| Dextrin (Vendor) | Reaction with NMA*[a] | Percent NMA incorporation (byNMR)[b] |
|---|---|---|
| corn-based dextrin, Stadex ® 140 | A | 28–32[d] |

*N—methylolacrylamide
[a] A = no gelation, product precipitated in CH$_3$OH and dried. B = gelation occurred.
[b] percent means percent of sugar units in the dextrin with an incorporated double bond.
[c] NMA monomer present in substantial amounts.
[d] Seven runs all fell within the range indicated.

The data showed that no gelatin occured in the case of 8 of the dextrins tested and substantial amounts of NMA were incorporated into the dextrin starting material.

EXAMPLE 9

Chemically grained and anodized aluminum was subcoated with a solution having the following formula.

| | |
|---|---|
| pentaerythritol tetraacrylate (Sartomer Co., subsid. of Atlantic Richfield, West Chester, PA) | 29.6 g |
| polymethacrylated urethane oligomer (preparation II in U.S. Pat. No. 4,228,232) (63.8 percent) | 24.8 g |
| Formvar ® 12/85 (10 percent) [poly(vinyl formal), prepared from a polyvinyl acetate starting material and having 85 percent of the acetate groups replaced by alcohol and formal groups (the polyvinyl acetate having a viscosity of about 12 cp at 25° C., as 86 grams in 1000 ml of benzene) Monsanto Co., St. Louis, Missouri]. | 103.2 g |
| poly(vinyl acetal) polymer (preparation V in U.S. Pat. No. 4,228,232)(15.8 percent) | 27.4 g |
| Michler's ketone 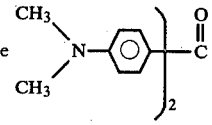 | 1.5 g |
| diphenyliodonium hexafluorophosphate | 3.0 g |
| triethylamine | 1.4 g |
| n-propanol/water azetrope | 606.0 g |

Coatings were made with a #13 wire-wound rod, dried 2 minutes at 66° C. (150° F.) and irradiated 10 seconds under the glass (no vacuum) in a Berkey-Ascor Printer with a 5 kw mercury-metal halide lamp.

A second solution was prepared with the following composition:

| | |
|---|---|
| crude acrylamidomethyl dextrin (with 25 weight percent NMA monomer) from Example 1 (25 percent) | 24.0 g |
| water | 6.0 g |
| Thioflavin T, TG (Basic Yellow 1), (Matheson Coleman & Bell, Norwood, Ohio) | 0.09 g |
| diphenyliodonium chloride | 0.24 g |
| octylphenoxy polyethoxyethanol, Triton ® X-100 (10 percent; Rohm & Haas Co.) | 0.30 g |

This solution was coated on the cured, subcoated aluminum described above using a #10 and #18 wire-wound rod and dried 2 minutes at 66° C. (150° F.). Plates were exposed 2, 4 and 8 seconds in the above-mentioned Berkey-Ascor Vacuum Printer (BTC Berkey Technical Co., Woodside, N.Y.) through a half-tone positive. The plates were developed with water, mounted on a Meihle (Miehle Co., Div. of Miehle-Goss-Dexter, Inc., Chicago, IL) sheet-fed press and the press was run in a manner that greatly accelerated plate wear. The plates rolled up printing a positive image. Wear on the plates resulted from loss of the hydrophilic photopolymer in the background. Breakdown is summarized in TABLE III.

TABLE III

| Exposure, seconds | First sign of wear number of impressions |
|---|---|
| #10 Coating Rod - 400 mg/ft$^2$ | |
| 2 | 1,000 |
| 4 | 3,500 |
| 8 | 6,000 |
| #18 Coating Rod - 550 mg/ft$^2$ | |
| 2 | 4,000 |
| 4 | 9,000 |
| 8 | 12,000 |

Clearly photopolymerization of the acrylamidomethyldextrin/NMA coating on the given substrate forms a layer that is both durable and hydrophilic and can therefore provide the background of a lithographic printing surface.

EXAMPLE 10

A slurry was prepared by combining the following:

| | |
|---|---|
| ethylenically-unsaturated urethane oligomer*, (disclosed in assignee's copending patent application U.S.S.N. 270,841, filed June 5, 1981) | 18.4 g |
| diphenyliodonium hexafluorophosphate (3M) | 0.8 g |
| Michler's ketone | 0.8 g |
| 5 percent gamma-methacryloxypropyltrimethoxysilane [(CH$_2$=C(CH$_3$)CO$_2$(CH$_2$)$_3$Si(OCH$_3$)$_3$, Dow Corning Corp.] treated 8 micrometer quartz | 20.0 g |
| 1,1,2-trichloroethylene | 20.0 g |

| | |
|---|---|
| methyl ethyl ketone | 20.0 g |

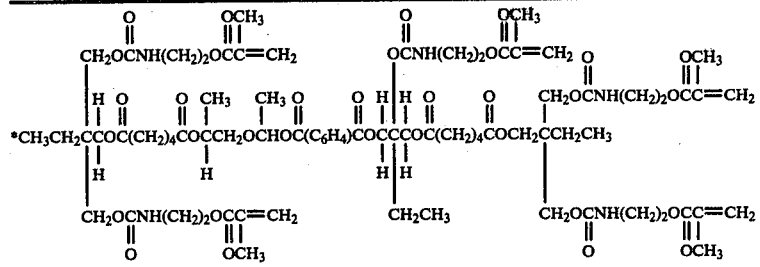

This oligomer was prepared as follows:

Into a reaction flask equipped with an agitator, liquid addition funnel, thermometer, and inlet tube for the introduction of a dry nitrogen atmosphere was placed 600 g (0.6 mole) of a low molecular weight polyol prepared from trimethylolpropane, adipic acid, dipropylene glycol, and phthalic anhydride, Lexorez® 5171-280 (Inolex Corp.), 1.5 g dibutyltin dilaurate, and 2.1 g "Irganox" 1010 antioxidant ((tetrakis)3-(3,5-di(t-butyl)-4-hydroxyphenyl)propionyloxymethyl)methane, commercially available from Ciba Geigy, Inc.). The resulting mixture was agitated, and 465 g (3.0 moles) of 2-isocyanatoethyl methacrylate was added to the reaction flask over a 30 minute period, with the rate of addition of the 2-isocyanatoethyl methacrylate being adjusted to keep the temperature of the reaction mixture from exceeding about 75° C. A heating mantle was placed about the reaction flask, and the reaction mixture was heated for an additional 30 minutes at a temperature of about 70° to 75° C., until infrared analysis of the reaction mixture indicated that the isocyanate groups had been consumed. The reaction product, which was the desired oligomer, was allowed to cool.

The composition was placed in a 200 cc jar with glass marbles and milled for 26.5 hours on a two-roll mill. Slurry brush grained aluminum was subbed with this slurry by coating with a #4 wire-wound rod, drying one minute at 66° C. (150° F.), and irradiating 40 seconds at 20.3 cm (8 inches) from a 5 kw mercury metal halide light source. Three dispersions (A, B, and C) were prepared with the following compositions:

| | Weight, g | | |
|---|---|---|---|
| Component | A | B | C |
| water | 10.0 | 10.0 | 10.0 |
| 1,3-diacrylamido-2-hydroxypropane | 1.3 | 1.3 | 1.3 |
| 2,3-dihydroxy-1-acrylamidopropane (31 percent) | 2.1 | 2.1 | 2.1 |
| Colanyl Red (50 percent) (American Hoechst Corp.) | 0.67 | 0.67 | 0.67 |
| silica gel, Syloid ® 244 (W. R. Grace Co.) | 1.95 | 1.95 | 1.95 |
| diphenyliodonium hexafluorophosphate (3M) | 0.1 | 0.1 | 0.1 |
| *water-soluble Michler's ketone analog, 4,4'-Bis-(N—2-carboxy-ethyl-N—methylamino)benzophenone disodium salt (2 percent) | 7.7 | 7.7 | 7.7 |
| dextrin starch hydrolyzate, canary corn Stadex ® 140 (A. E. Staley Mfg. Co., Decatur, IL; 15 percent) | 20.0 | — | — |
| acrylamidomethyl starch (D.S. = 0.05), Starpol ® 100 (A. E. Staley Mfg Co.; 15 percent) | — | 20.0 | — |
| acrylamidomethyl dextrin (D.S. = 0.32; i.e., 32 percent of glucose units reacted with | — | — | 3.0 |

| | Weight, g | | |
|---|---|---|---|
| Component | A | B | C |
| N—methylolacrylamide; prepared from Stadex ® 140); see Example 7 | | | |

*water-soluble Michler's ketone analog was prepared as follows: N—methylaniline (375.2 g, 3.5 moles) was condensed with methyl acrylate (301.4 g, 3.5 moles) in the presence of 35 ml of glacial acetic acid, by heating to 110° C. for 72 hours. The resulting product was isolated by distillation. Spectral analysis indicated the presence of the desired product having the formula

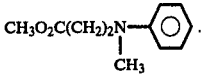

200.0 g (1.03 moles) of the product obtained above was condensed with 84.0 g (1.0 mole, 2.0 eq.) of 37 percent aqueous formaldehyde in the presence of 13.5 g of concentrated hydrochloric acid and 600 ml of methanol. The mixture was refluxed for 18.5 hours. The reaction product was extracted, washed, and dried. Spectral analysis indicated the presence of the bis compound reaction product having the formula

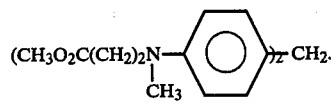

A solution of 8.80 g (0.022 moles) of the bis compound reaction product in 20 ml of methanol and 5 ml of chloroform was stirred for 15 minutes and then DDQ (10.0 gm, 0.044 moles) was added over a 5-minute period. The reaction mixture was stirred for 5 minutes at room temperature and for 1 hour at reflux. The ketodiester reaction product was extracted, washed, dried, chromatographed, and then identified by spectral analysis as the compound

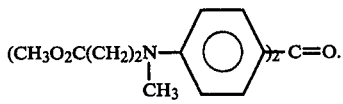

3.51 g (8.51 mmol) of the ketodiester in 125 ml of 10 percent sodium hydroxide/methanol was refluxed for 1 hour and was completely converted to the ketodiacid. The ketodiacid was acidified with aqueous sulfuric acid and the crystals produced were purified by recrystallization from ethanol and identified by spectral and combustion analysis as the desired MKA having the formula

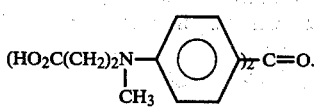

The free acid is converted to the salt as follows: a 2 percent stock solution of the MKA was prepared by combining 1 g of 4,4'-bis(N-2-carboxyethyl-N-methylamino)benzophenone with 49 g of 0.1 N sodium hydroxide and stirring. A small amount of additional sodium hydroxide or sensitizer was added to adjust the solution to a pH of 7.8.

Dispersion of the silica was achieved by milling for about three days using glass marbles. The three dispersions were coated on the above-described, subcoated aluminum using a wire-wound rod and dried for two minutes at 66° C. (150° F.). Dry coating weight was about 4.12 g/m$^2$ (385 mg/ft$^2$). The resulting plates were exposed and developed with water and the results are shown in TABLE IV:

TABLE IV

| Dispersion | Exposure, seconds | Ghost step[a] | Coating weight loss in percent |
|---|---|---|---|
| A | 5 | None | 94 |
|   | 120 | None | 92 |
| B | 5 |   | 68 |
|   | 20 | 8+ | 56 |
| C | 5 | 7 | 5 |

[a]Ghost step - first step (lowest exposure step) where an image is visibly discernible from the background.

The data show that the formulation with the acrylamidomethyl dextrin polymerizes much more completely than those with the unmodified dextrin or the commercially available starch with a lower degree of substitution.

EXAMPLE 11

The solubility of the purified acrylamidomethyldextrin oligomer of Example 1 (dextrin-NMA) and three prior art starch materials were compared. In each case, 5.0 g of material were added to 195 g of deionized water. The mixture was stirred for 1½ hours at room temperature using a magnetic stirrer, and then gravity-filtered through no. 4 filter paper. The data is shown in TABLE V below.

TABLE V

| Sample | Material | Clarity before filtering | Clarity after filtering | Weight percent solubility | Weight percent solids |
|---|---|---|---|---|---|
| 1 | dextrin-NMA (see Example 1) | slightly turbid (clearest of the 4 samples) | slightly turbid (better than #2 and #3) | 84 | 2.1 |
| 2 | dextrin, Stadex ® 140 | cloudy/turbid | turbid | 56 | 1.4 |
| 3 | acrylamidomethyl-starch, Starpol ® 100 (cold H$_2$O soluble) | cloudy/turbid | turbid | 52 | 1.3 |
| 4 | acrylamidomethyl-starch, Starpol ® 100 | very turbid | clear | .016 | negligible (4.0 × 10$^{-4}$) |

The data of TABLE V show that dextrin-NMA, sample 1, was considerably more soluble than starch materials known in the art.

Various modifications and alterations of this invention will become apparent to those skilled in the art without departing from the scope and spirit of this invention, and it should be understood that this invention is not to be unduly limited to the illustrative embodiments set forth herein.

We claim:

1. A photocurable, ethylenically-unsaturated oligomer comprising the reaction product of
   (1) 100 parts by weight of a dextrin compound, said dextrin compound being non-gelling at temperatures up to 98° C. when heated in the presence of water, N-methylolacrylamide, and carboxylic acid,
   (2) 35 to 70 parts by weight of at least one ethylenically-unsaturated monomer capable of reacting with at least one hydroxyl group of the dextrin compound, said oligomer having an average in the range of 0.20 to 0.45 ethylenically-unsaturated moiety per every anhydroglucose unit and an equivalent weight of 440 to 990, and at least 75 weight percent of said oligomer is water soluble at 20° C. in a concentration of at least 2.5 percent by weight.

2. The oligomer according to claim 1 having the formula

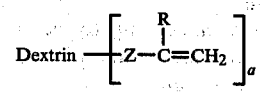

wherein
Dextrin is a carbohydrate intermediate in chain length between starch and glucose;
Z is an organo linking group having up to 8 atoms selected from carbon, nitrogen, and oxygen;
R is hydrogen or a lower alkyl group; and
a, the degree of substitution, has a value of 0.20 to 0.45.

3. The oligomer according to claim 2 wherein Z has the formula

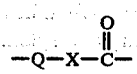

wherein Q is a divalent organo group having up to 6 atoms selected from carbon, nitrogen, and oxygen, and X is N—H or O.

4. The oligomer according to claim 2 wherein Z is selected from the group consisting of

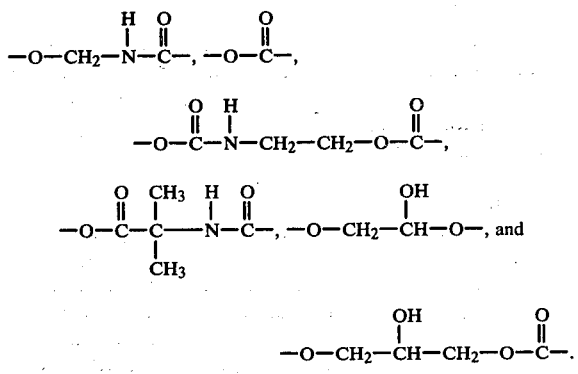

5. The oligomer according to claim 4 wherein Z is a

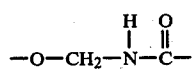

group.

6. The oligomer according to claim 1 wherein said ethylenically-unsaturated monomer contains an acrylamido group.

7. The oligomer according to claim 1 wherein said ethylenically-unsaturated monomer contains an acrylamidomethyl group.

8. The oligomer according to claim 1 wherein said dextrin is a canary corn starch hydrolyzate.

9. A hydrophilic, water-insoluble polymer which is the photocured product of the oligomer according to claim 1 reacted with at least one ethylenically-unsaturated monomer.

10. A process for preparing the oligomer according to claim 5 comprising the steps of:
a. admixing
1. 100 parts by weight of a dextrin compound, said dextrin compound being non-gelling at temperatures up to 98° C. when heated in the presence of water, N-methylolacrylamide, and carboxylic acid,
2. 35 to 70 parts by weight of at least one ethylenically-unsaturated monomer capable of reacting with at least one hydroxyl group of the dextrin compound,
3. 1 to 6 parts by weight of carboxylic acid catalyst, and
4. 0.0002 to 0.0006 parts by weight of a polymerization inhibitor,
b. reacting said admixture, and
c. purifying the resultant oligomer by precipitating in a polar organic solvent;
said oligomer having an average in the range of 0.20 to 0.45 ethylenically-unsaturated moiety per every anhydroglucose unit and an equivalent weight of 440 to 990, and at least 75 weight percent of said oligomer is water soluble at 20° C. in a concentration of at least 2.5 percent by weight.

11. A process for preparing the oligomer according to claim 5 comprising the steps of:
a. hydrolyzing a starch to provide a dextrin compound,
b. admixing
1. 100 parts by weight of said dextrin compound, said dextrin compound being non-gelling at temperatures up to 98° C. when heated in the presence of water, N-methylolacrylamide, and carboxylic acid,
2. 35 to 70 parts by weight of at least one ethylenically-unsaturated monomer capable of reacting with at least one hydroxyl group of the dextrin compound,
3. 1 to 6 parts by weight of carboxylic acid catalyst, and
4. 0.0002 to 0.0006 parts by weight of a polymerization inhibitor,
c. reacting said admixture, and
d. purifying the resultant oligomer by precipitating in a polar organic solvent; said oligomer having an average in the range of 0.20 to 0.45 ethylenically-unsaturated moiety per every anhydroglucose unit and an equivalent weight of 440 to 990, and at least 75 weight percent of said oligomer is water soluble at 20° C. in a concentration of at least 2.5 percent by weight.

* * * * *